United States Patent
Tseng et al.

(10) Patent No.: US 8,324,068 B2
(45) Date of Patent: Dec. 4, 2012

(54) NONVOLATILE MEMORY AND FABRICATION METHOD THEREOF

(75) Inventors: Tseung-Yuen Tseng, Hsinchu (TW); Chun-Chieh Lin, Hualien (TW); Chao-Cheng Lin, Taichung (TW)

(73) Assignee: Winbond Electronics Corp., Hsinchu (TW)

( * ) Notice: Subject to any disclaimer, the term of this patent is extended or adjusted under 35 U.S.C. 154(b) by 63 days.

(21) Appl. No.: 12/943,487

(22) Filed: Nov. 10, 2010

(65) Prior Publication Data

US 2011/0059592 A1    Mar. 10, 2011

Related U.S. Application Data

(62) Division of application No. 11/723,547, filed on Mar. 20, 2007, now Pat. No. 7,851,888.

(51) Int. Cl.
*H01L 21/20* (2006.01)

(52) U.S. Cl. ........ 438/382; 438/104; 257/536; 257/537; 257/E21.004; 257/E21.011; 365/148

(58) Field of Classification Search .............. 257/4, 298, 257/536, 537; 438/85, 104, 382
See application file for complete search history.

(56) References Cited

U.S. PATENT DOCUMENTS

| | | |
|---|---|---|
| 5,337,207 A | 8/1994 | Jones et al. |
| 6,093,338 A | 7/2000 | Tani et al. |
| 6,528,863 B1 | 3/2003 | Klee et al. |
| 6,955,992 B2 | 10/2005 | Zhang et al. |
| 2004/0043520 A1 | 3/2004 | Kondo et al. |
| 2004/0160812 A1 | 8/2004 | Rinerson et al. |
| 2005/0040482 A1 | 2/2005 | Suzuki et al. |
| 2005/0151156 A1* | 7/2005 | Wu et al. .................. 257/107 |
| 2006/0131628 A1* | 6/2006 | Tseng et al. .............. 257/295 |
| 2007/0095653 A1 | 5/2007 | Ohashi et al. |

* cited by examiner

*Primary Examiner* — Tom Thomas
*Assistant Examiner* — Farid Khan
(74) *Attorney, Agent, or Firm* — Muncy, Geissler, Olds & Lowe, PLLC

(57) ABSTRACT

Non-volatile memories formed on a substrate and fabrication methods are disclosed. A bottom electrode comprising a metal layer is disposed on the substrate. A buffer layer comprising a $LaNiO_3$ film is disposed over the metal layer. A resistor layer comprising a $SrZrO_3$ film is disposed on the buffer layer. A top electrode is disposed on the resistor layer.

9 Claims, 9 Drawing Sheets

US 8,324,068 B2

NONVOLATILE MEMORY AND FABRICATION METHOD THEREOF

CROSS-REFERENCE TO RELATED APPLICATION

This application is a Divisional of co-pending application Ser. No. 11/723,547, filed on 20 Mar. 2007, now U.S. Pat. No. 7,851,888 and for which priority is claimed under 35 U.S.C. §120; the entire contents of which is hereby incorporated by reference.

This application is related to U.S. patent application Ser. No. 11/108,823, filed Apr. 19, 2005, commonly owned by Winbond and entitled as "NONVOLATILE MEMORY AND FABRICATION METHOD THEREOF", the contents of which are hereby incorporated by reference in their entirety.

BACKGROUND OF THE INVENTION

1. Field of the Invention

The invention relates to a non-volatile memory and a fabrication method thereof, and more particularly, to a resistive non-volatile memory and a fabrication method thereof.

2. Description of the Related Art

Memory devices are typically divided into volatile and non-volatile types. With volatile memory devices, such as DRAM or SRAM, a continuous power supply is required to store data. For non-volatile memory devices, such as ROM, data can be stored therein for long periods of time without power supply.

As mobile phones, digital cameras, personal digital assistants (PDAs), notebooks, and other portable electronic devices become more popular, non-volatile memory devices are widely applied therein due to their ability to retain stored data without requiring power supply and low energy consumption. Among non-volatile memory devices, flash memory is currently popular. As the semiconductor technology improves, flash memory devices face challenges of high operating voltage (causing difficulty for device size conservation) and gate oxide thinning (causing unsatisfactory retention time). Thus, many new non-volatile memories have been developed to replace flash memories. Among these, resistive non-volatile memory provides high write and erase speeds, low operating voltage, long retention time, simple structure, low power consumption, small size, and low cost.

FIG. 1 is a schematic diagram of a conventional resistor type non-volatile memory 10, disposed on a substrate 12, comprising a dielectric layer 14, a bottom electrode 16, a resistor layer 18, and a top electrode 20. The bottom electrode 16 comprises a platinum film. The resistor layer 18 comprises a chromium (Cr) doped strontium titanate single crystal and provides reversible resistance switching.

However, according to conventional methods, fabrication of the resistor layer 18 still presents problems. For example, two methods are typically used. In one, a single crystal structure of $SrTiO_3$ is formed with an orientation (100) and then undergoes flame fusion to form a Cr doped $SrTiO_3$ single crystal. Alternatively, a pulse laser sputtering process is used to grow a Cr doped $SrZrO_3$ film. However, the single crystal structure used in the previous method generates high cost. The latter method is not suitable for large area films. Thus, neither method can meet the requirements of mass production.

BRIEF SUMMARY OF THE INVENTION

An embodiment of the invention provides a non-volatile memory formed on a substrate. A bottom electrode comprising a metal layer is disposed on the substrate. A buffer layer comprising a $LaNiO_3$ film is disposed over the metal layer. A resistor layer comprising a $SrZrO_3$ film is disposed on the buffer layer. A top electrode is disposed on the resistor layer.

Further provided is a method of fabricating a non-volatile memory on a substrate. A metal layer acting as a bottom electrode of the non-volatile memory is formed over the substrate. A buffer layer comprising a $LaNiO_3$ (LNO) film is then formed over the metal layer. A resistor layer comprising a $SrZrO_3$ (SZO) film is formed on the buffer layer. A top electrode is then formed on the resistor layer.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
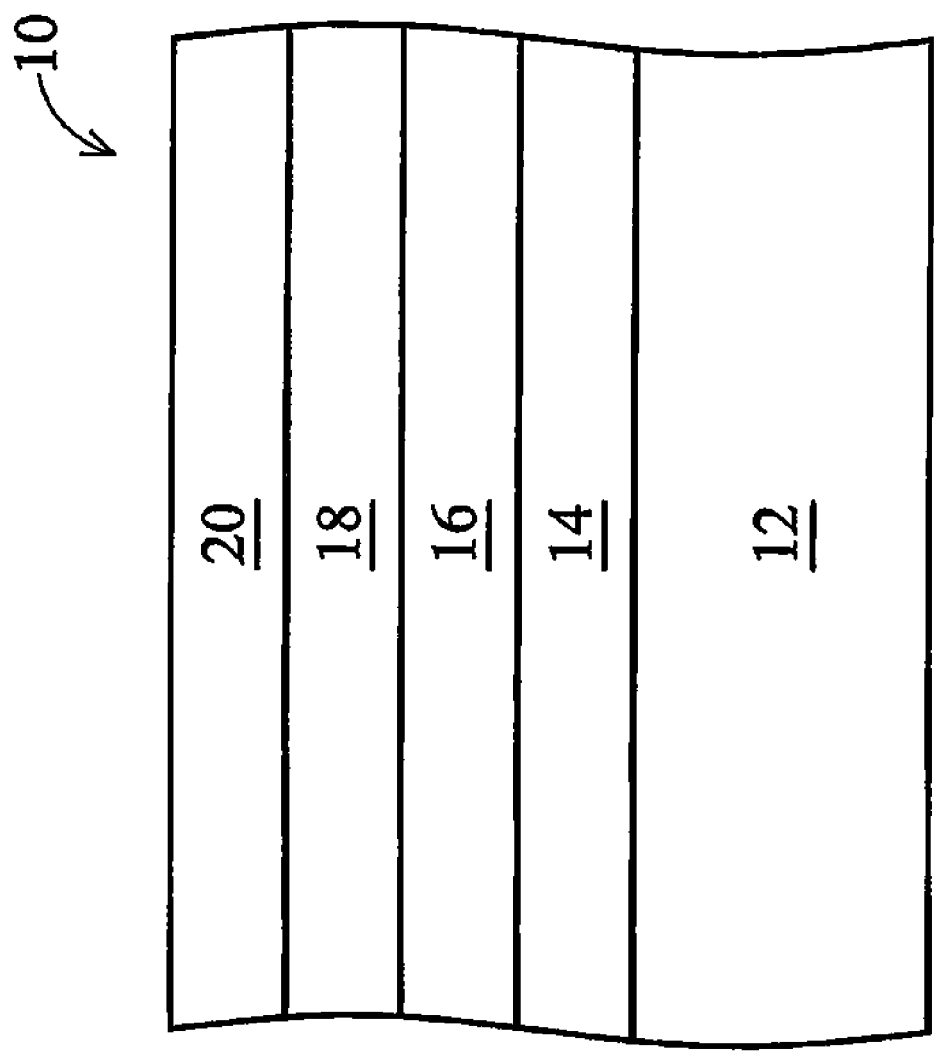
FIG. 1 is a schematic diagram of a conventional resistor type non-volatile memory.
Figure 2B:
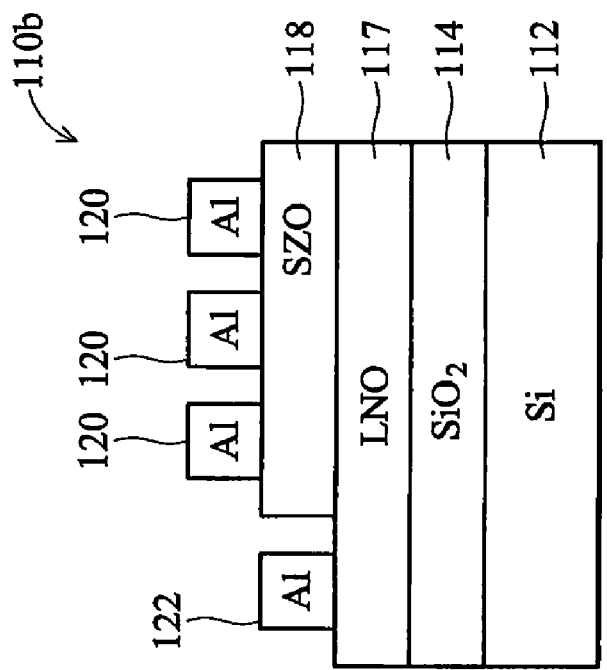
FIG. 2b is a cross-section of a control memory.
Figure 2A:
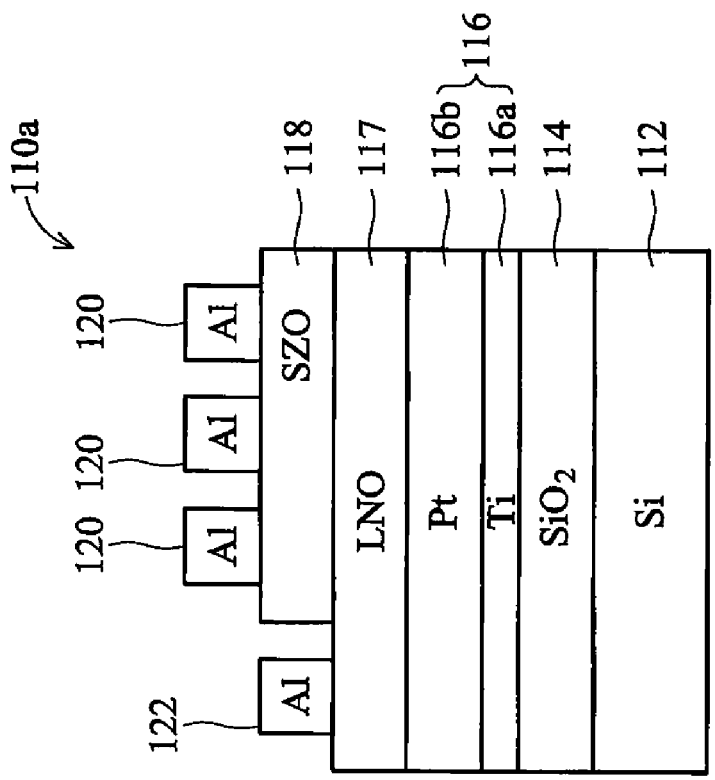
FIG. 2a is a cross-section of a first embodiment of a resistive non-volatile memory of the invention.

FIG. 2a is a cross-section of a first embodiment of a resistive non-volatile memory 110a of the invention. As shown in FIG. 2a, the memory 110a comprises a substrate 112, a dielectric layer 114, a bottom electrode 116, a buffer layer 117, a resistor layer 118, and top electrodes 120 stacked in sequence. A predetermined area of buffer layer 117 is not covered by resistor layer 118 such that a metal connector 122 therein directly contacts buffer layer 117. Top electrodes 120 and metal connector 122 can be formed using the same metal layer and the same photo mask. Top electrodes 120 can together act as one terminal of the resistive non-volatile memory 110a, and metal connector 122 as the other.

In an embodiment, the dielectric layer 114 comprises a silicon oxide layer with a thickness of 100 to 500 nm on a substrate of P-type silicon. The bottom electrode 116 comprises a titanium film 116a of about 1 nm to 100 nm and a platinum film 116b of about 10 nm to 500 nm, where platinum film 116b is stacked on the titanium film 116a over the dielectric layer 114. The buffer layer 117 comprises a LaNiO$_3$ film of highly preferred (100) and (200) orientation structure at a thickness of about 20 nm to 500 nm. The resistor layer 118 comprises a SrZrO$_3$ film doped with dopants comprising V, Cr, Fe, Nb, or combination thereof. The dopant concentration is about 0.05% to 1.5% by atomic percentage. The thickness of the resistor layer 118 is about 20 nm to 500 nm. The top electrodes 120 and the metal connector 122 comprise an aluminum film.

In an embodiment of a method of fabricating the nonvolatile memory 110a, a substrate 112, such as a silicon substrate, is first provided and then cleaned by standard Radio Corporation of America (RCA) cleaning process. After cleaning, a thermal oxidation is preformed to grow a silicon oxide layer on the substrates 112 as the dielectric layer 114 to isolate leakage current from the substrate 112. Then, E-gun evaporation is performed to form a titanium film 116a on the dielectric layer 114. Similarly, another E-gun evaporation is performed to form a platinum film 116b on the titanium film 116a. Then, a radio-frequency (RF) magnetron sputtering process is performed to form a LaNiO$_3$ film as a buffer layer 117 on the platinum film 116b. In the radio-frequency magnetron sputtering process, the LaNiO$_3$ film 117 is grown at 250° C. Plasma power density is about 3.3 W/cm$^2$, with working pressure 10 mTorr and gas flow rate 40 sccm. The ratio between Ar and O$_2$ is 6:4. Note that the formed LaNiO$_3$ film has a highly preferred orientation structure, such as (100) or (200).

Figure 3B:
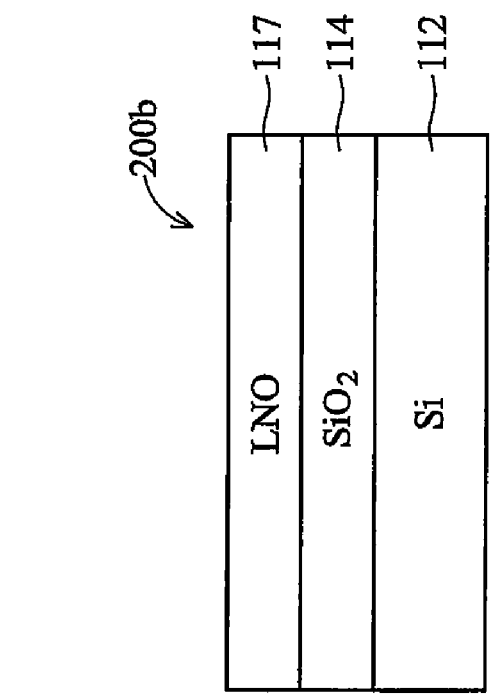
FIGS. 3a and 3b show an experimental structure and a control structure, respectively.
Figure 3A:
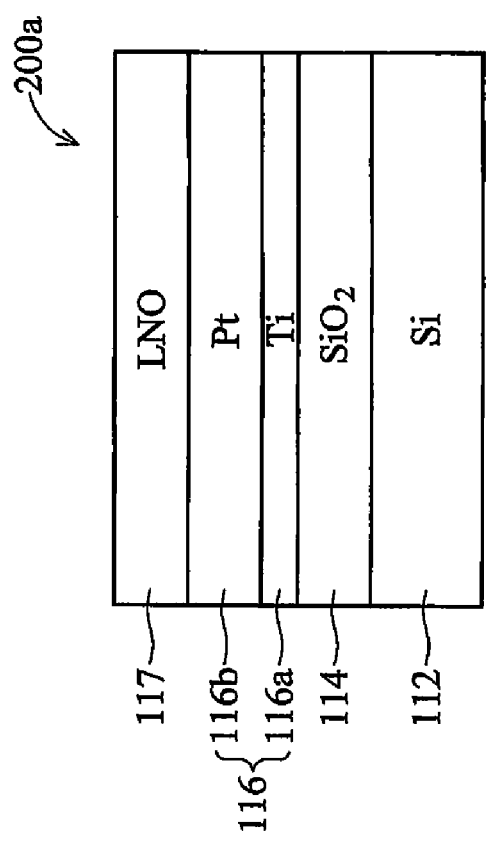
Figure 4A:
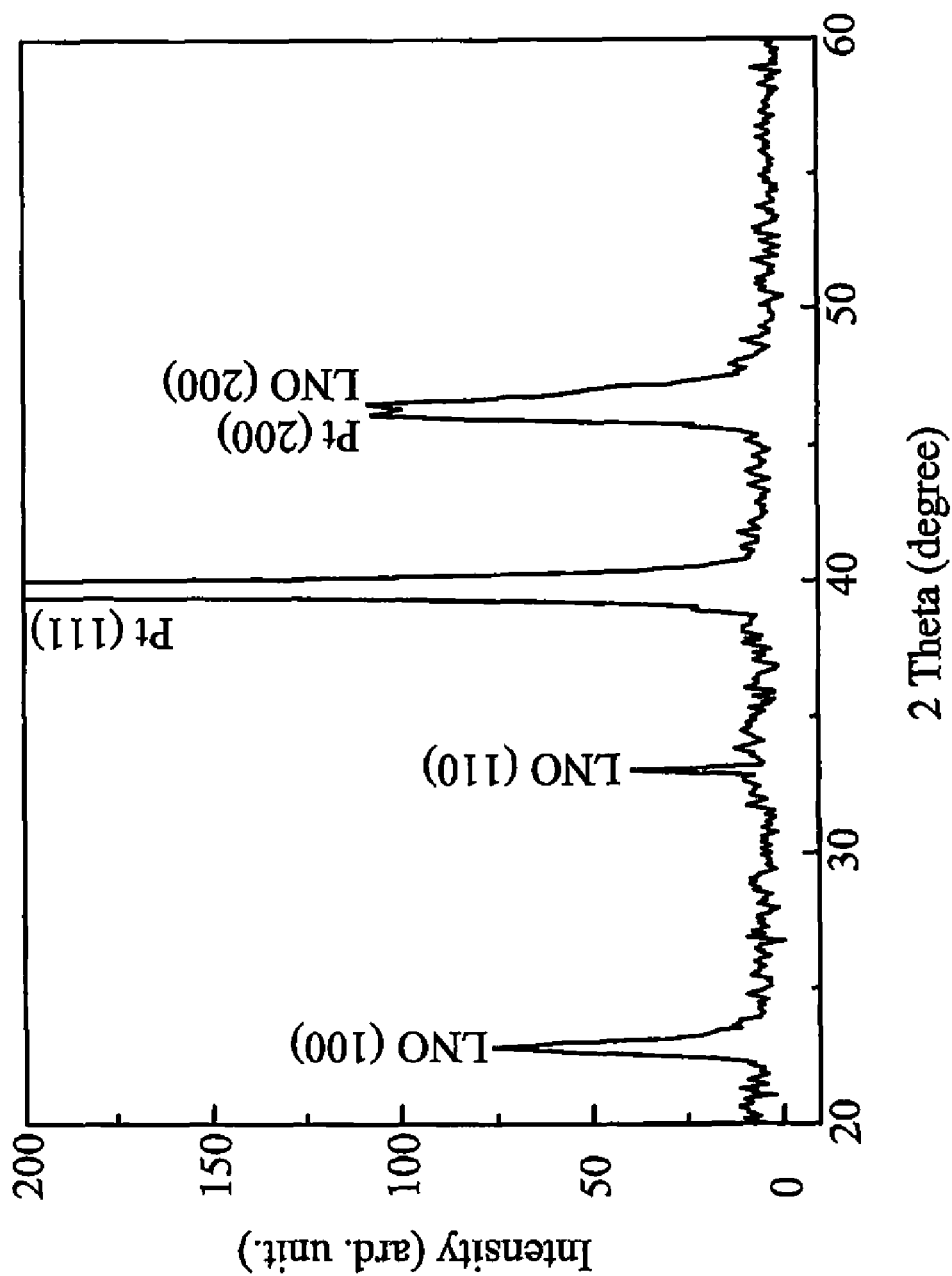
FIGS. 4a and 4b show two X-ray diffraction patterns corresponding to the experimental structure of FIG. 3a and the control structure of FIG. 3b, respectively.
Figure 4B:
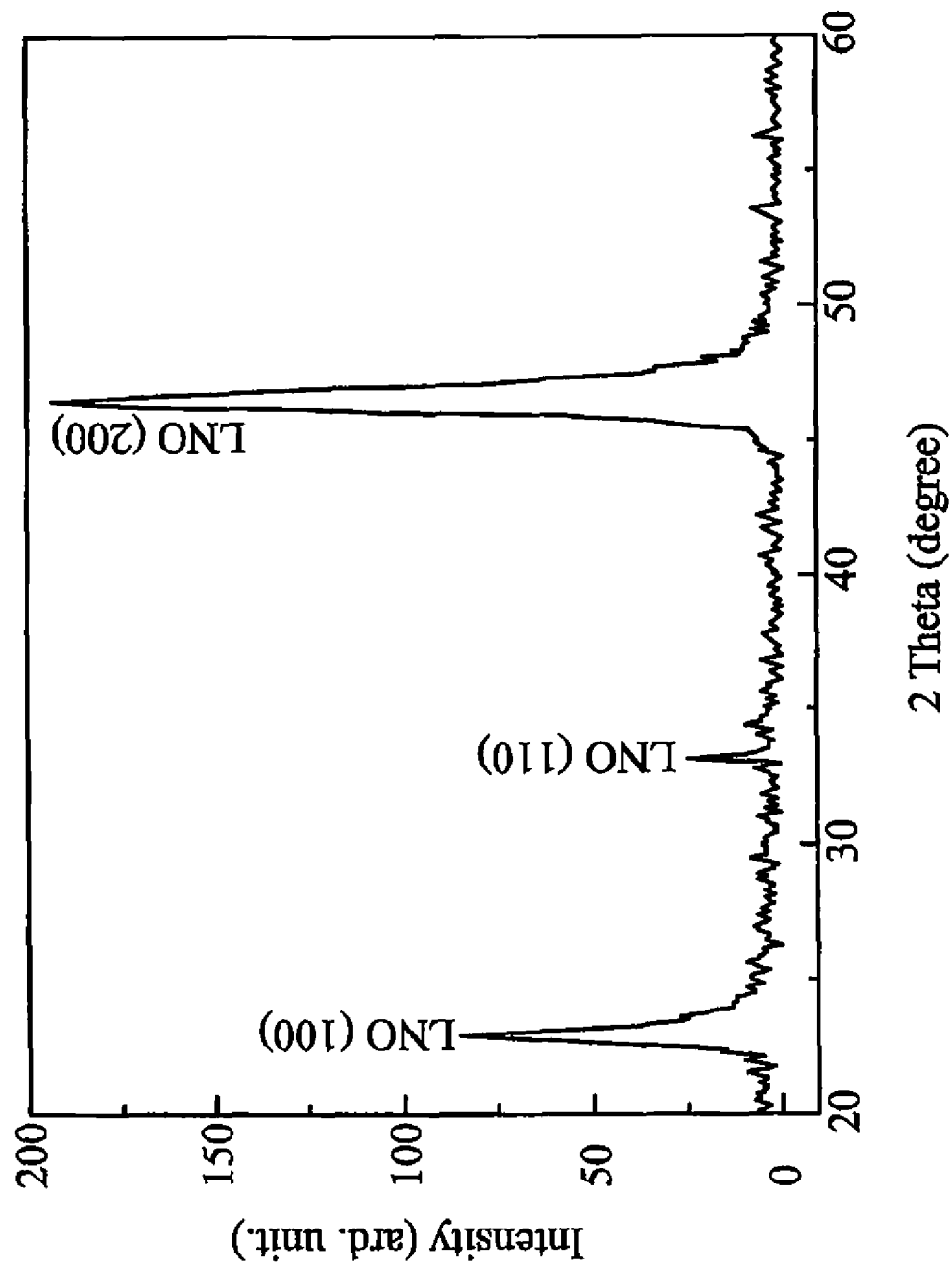

FIG. 3a shows an experimental structure 200a formed according to the process described. FIG. 3b shows a control structure 200b, formed with the buffer layer 117 directly contacting the dielectric layer 114. The control structure in FIG. 3b differs from experimental structure 200a in the omission of bottom electrode 116. LaNiO$_3$ film with a lattice orientation of (100) is preferred since a SrZrO$_3$ film stacked thereon has a larger resistive ratio between two current states and requires less voltage to switch between the two current states, in comparison with the SrZrO$_3$ film stacked on a (110)-oriented LaNiO$_3$ film. FIGS. 4a and 4b show two X-ray diffraction patterns corresponding to the experimental structure 200a of FIG. 3a and the control structure 200b of FIG. 3b, respectively. Apparently, the peaks in FIG. 4b illustrates that the LaNiO$_3$ film in FIG. 3b has a lattice orientation of (100), as does the LaNiO$_3$ film formed on a platinum film in FIG. 3a, as shown by the peaks in FIG. 4a. Irrespective of whether it is formed directly on a SiO$_2$ film or a platinum film, a LaNiO$_3$ film has a lattice orientation of (100), which is preferred.

The experimental structure 200a in FIG. 3a and the control structure 200b in FIG. 3b can be further processed simultaneously, for the purpose of device characteristic measurement. A radio-frequency magnetron sputtering process is then performed using SrZrO$_3$ as a target material to form a SrZrO$_3$ film with a thickness of 20 nm to 500 nm (of which 45 nm is preferred) acting as the resistor layer 118 on buffer layer 117. In an embodiment, the target material is doped with dopants comprising V, Cr, Fe, Nb, or a combination thereof at a dopant concentration about 0.05% to 1.5% by atomic percentage. As a result, the resistor layer 118 formed on buffer layer 117 has a corresponding dopant concentration. In addition, the growth temperature of the resistor layer 118 is about 500° C. Plasma power density is about 3.3 W/cm$^2$, with working pressure about 10 mTorr, and gas flow rate about 40 sccm. The ratio between Ar and O$_2$ is about 6:4. During the RF magnetron sputtering process, a predetermined area of buffer layer 117 is shielded, preventing from being coated by resistor layer 118, such that the buffer layer 117 in the predetermined area is not covered by resistor layer 118. A thermal evaporating process is performed to form an aluminum film having a thickness of 300 nm on the resistor layer 118. A patterning process performed with a proper mask defines a pattern of the aluminum film and to form top electrodes 120 and metal connector 122, creating the cross-section shown in FIG. 2a for the experimental structure 200a of FIG. 3a and the cross-section shown in FIG. 2b for the control structure 200b of FIG. 3b. For convenience and clarity, memory 110a shown in FIG. 2a is referred to as an experimental device under test (DUT) and memory 110b shown in FIG. 2b as a control DUT, hereinafter.

Figure 5A:
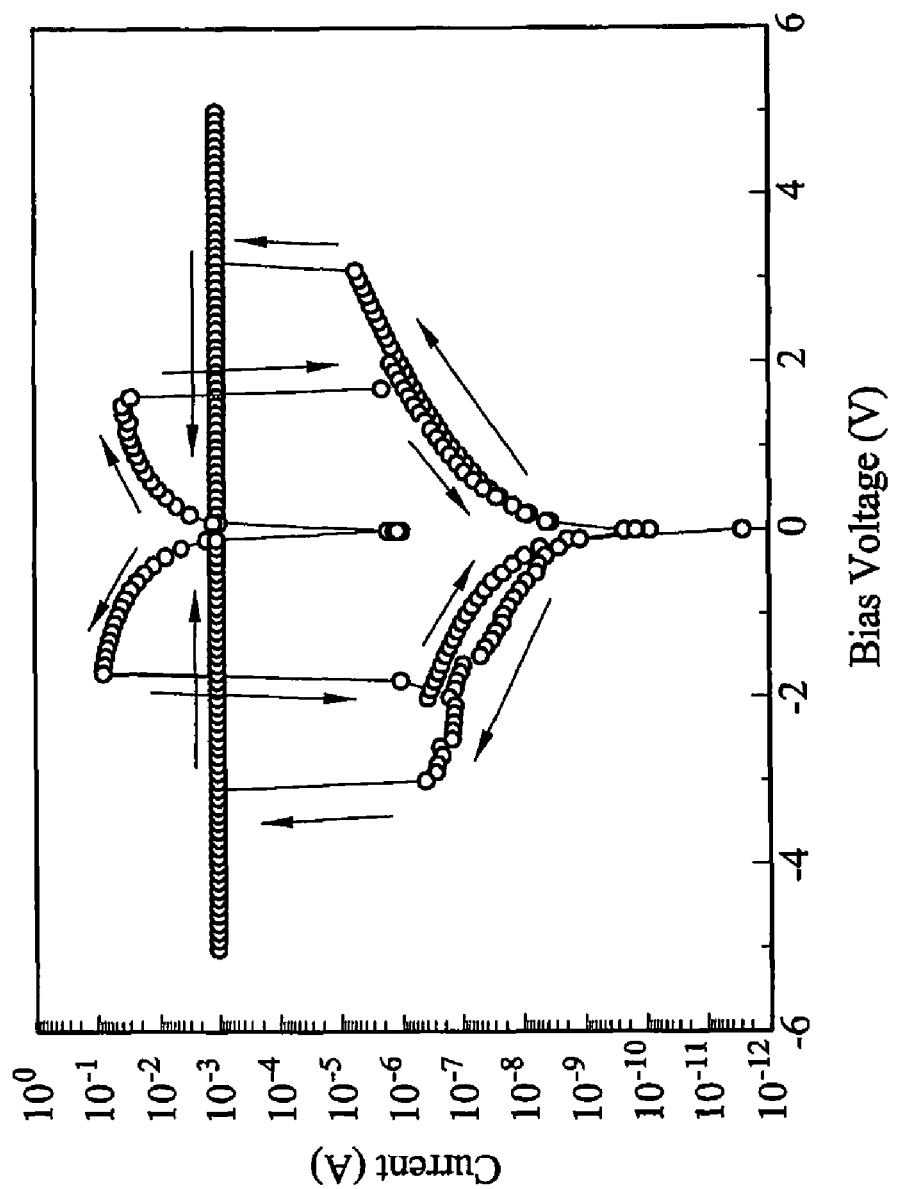
FIGS. 5a and 5b show voltage vs. current measurement results for the experimental DUT in FIG. 2a and the control DUT in FIG. 2b, respectively.
Figure 5B:
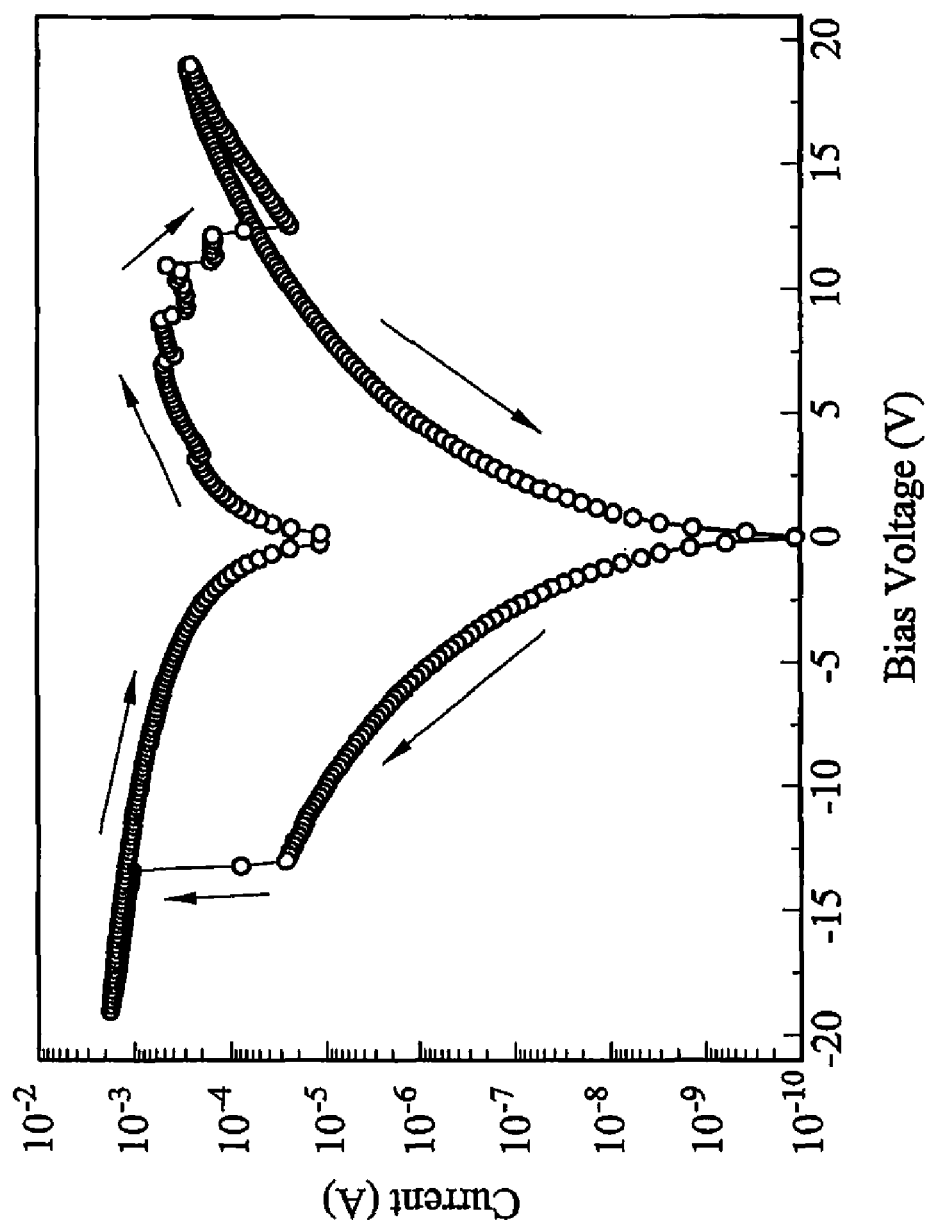

FIGS. 5a and 5b demonstrate voltage vs. current measurement results for the experimental DUT 110a in FIG. 2a and the control DUT 110b in FIG. 2b, respectively. As shown in FIG. 5b, a −13V bias voltage to the control DUT 110b suddenly increases the current therethrough, switching its current state from low to high, while a 12V voltage bias returns the control DUT 110b to the low current state, indicating that resistance of the control DUT 110b can be converted or switched by way of changing the polarity of a bias voltage, implementing a memory function. The resistive ratio for the high current state to the low current state around 0V voltage bias exceeds 10$^3$, as can be seen in FIG. 5b, and the switching between the current states is repeatable. The measurement results in FIG. 5a show, even so, an improved property of the experimental DUT 110a, which has an additional platinum film under the LaNiO$_3$ film in comparison with the control DUT 110b. Applying a −3V voltage bias suddenly increases the device current to the limited current (1 mA), indicating successful switching from a low current state to a high current state. Without limiting the device current, applying a −2V voltage bias also suddenly returns the device current to its original current state, switching from the high current state to the low current state. As shown in FIG. 5a, current state switching from high to low or low to high also occurs when applying 2V or 3V voltage bias, respectively. The phenomenon shown in FIG. 5a implies that changing the magnitude of a bias voltage can alter the resistance of the experimental DUT 110a such that a state is "remembered" therein. The resistive ratio for the experimental DUT 110a around 0V bias voltage is as high as over 10$^5$, and the switching between the current states is also repeatable.

It has also been found that a voltage pulse to switch the current state of control DUT 110b from low to high requires a pulse magnitude of −20V and a pulse width of 5 nanoseconds while that to switch from high to low requires a pulse magnitude of 20V and a very long pulse width of 500 microseconds. Comparatively, the current state of experimental DUT 110a has proven to be switchable from low to high by a voltage pulse having a pulse magnitude of −6V and a pulse width of 10 nanoseconds and from high to low by a voltage pulse having a pulse magnitude of −4V and a pulse width of 10 nanoseconds. The experimental DUT 110a thus demonstrates superior performance compared to the control DUT 110b lacking a platinum film.

Figure 6B:
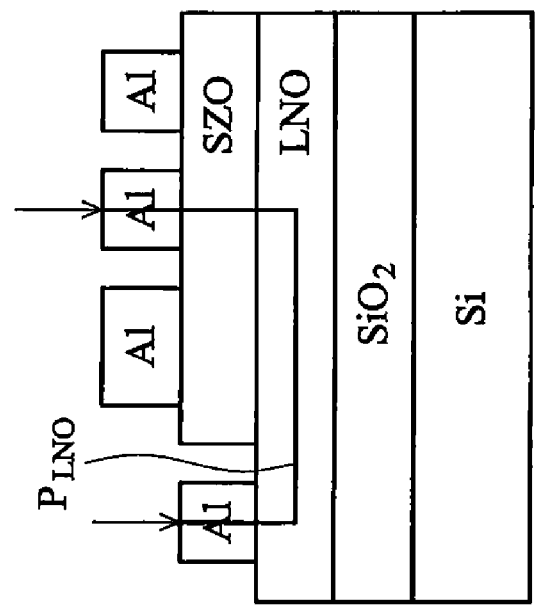
FIGS. 6a and 6b respectively depict current paths inside the experimental DUT in FIG. 2a and inside the control DUT in FIG. 2b.
Figure 6A:
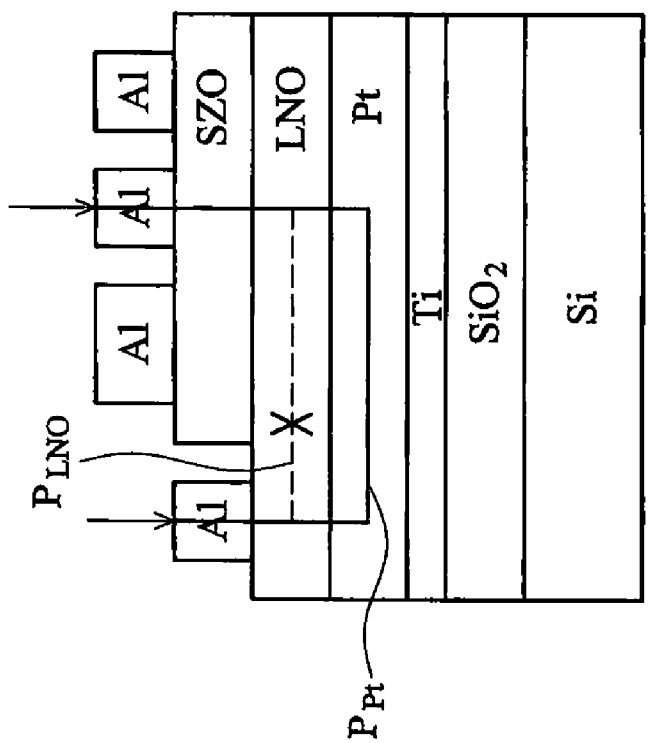

FIGS. 6a and 6b respectively depict current paths inside the experimental DUT 110a in FIG. 2a and inside the control DUT 110b in FIG. 2b. The experimental DUT 110a in FIG. 2a at its high current state shows a resistance of 20 Ohm but the control DUT 110b in FIG. 2b at its high current state shows a relatively significant resistance of 15 kOhm. Thus, the 15 kOhm is attributable to the path $P_{LNO}$ in FIG. 6b that extends horizontally inside the thin and highly resistive LaNiO$_3$ film. The overall current path in FIG. 6a cannot otherwise be as low as 20 Ohm. The platinum film provides a bypass $P_{Pt}$, through which the majority of the current in FIG. 6a goes horizontally inside the highly conductive platinum film 116*b* rather than inside the highly resistive LaNiO$_3$ film. The lower resistance of the current path in FIG. 6*a* mainly results in the lower voltage magnitudes or the narrower voltage pulse widths required for operating the experimental DUT 110*a* in FIG. 2*a*.

Figure 7:
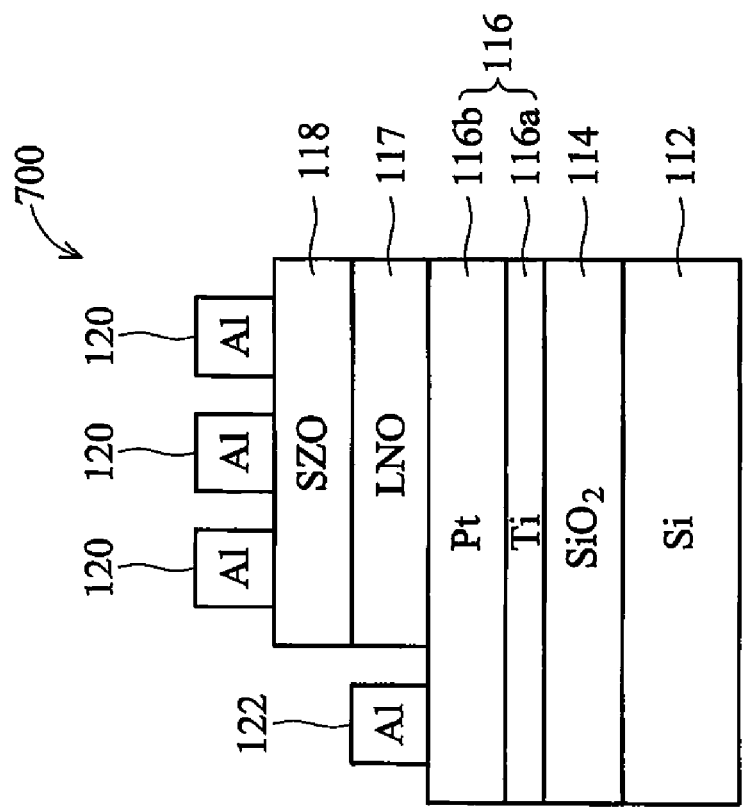
FIG. 7 is a cross-section of a second embodiment of a resistive non-volatile device of the invention.

FIG. 7 is a cross-section of a second embodiment of a resistive non-volatile device 700 of the invention. The device 700 in FIG. 7 is similar to the experimental DUT 110*a* in FIG. 2*a*, differing in that buffer layer 117 and resistor layer 118 of FIG. 7 do not cover a predetermined area of bottom electrode 116 where metal connector 122 contacts the bottom electrode 116. It is believed that device 700 in FIG. 7 exhibits the same device properties as the experimental DUT 110*a* in FIG. 2*a*.

Figure 8:
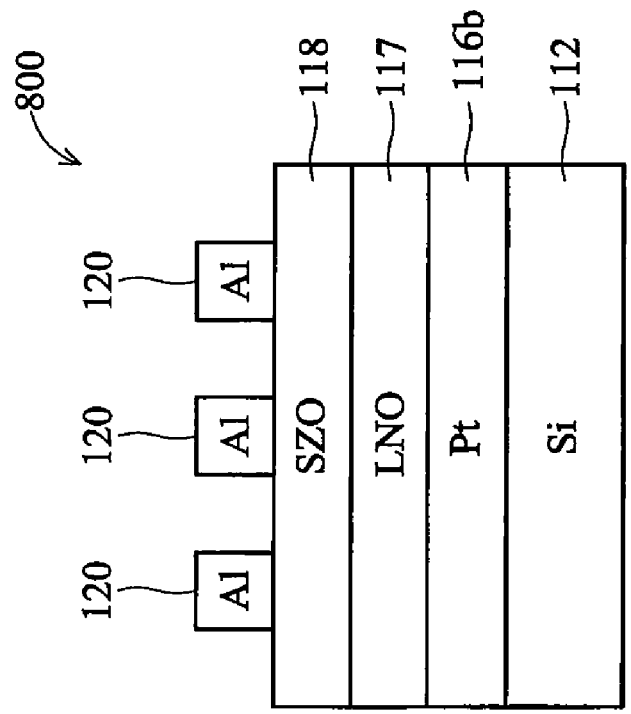
FIG. 8 shows a platinum layer acting as a bottom electrode directly contacting a silicon substrate without titanium film therebetween.

Titanium film 116*a* in FIG. 2*a* acts as an adhesive layer for a platinum layer 116*b* to be formed on a silicon oxide layer. If the platinum layer is to be formed directly on a silicon substrate, a titanium film therebetween can be omitted. FIG. 8 shows a platinum layer 116*b* acting as a bottom electrode and directly contacting silicon substrate 112 without a titanium film therebetween.

Compared with the control DUT 110*b* of FIG. 2*b*, the experimental DUT 110*a* of FIG. 2*a* has an additional bottom electrode 116 between buffer layer 117 and dielectric layer 114, obtaining lower operation voltages and narrower pulse width for current state switching. Hence, the experimental DUT 110*a* is better suited to integration in advanced integrated circuits that require low voltage power supply and low power consumption.

While the invention has been described by way of examples and in terms of preferred embodiment, it is to be understood that the invention is not limited to thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a non-volatile memory device on a substrate, comprising: forming a metal layer as a bottom electrode of the non-volatile memory over the substrate; forming a buffer layer comprising a LaNiO$_3$ film over the metal layer; forming a resistor layer comprising a SrZrO$_3$ film disposed on the buffer layer; forming a top electrode on the resistor layer, wherein a predetermined area of the buffer layer is not covered with the resistor layer thereon, and formation of the top electrode also forms a metal connector in the predetermined area contacting the buffer layer.

2. The method of claim 1, wherein the metal layer is formed by evaporation.

3. The method of claim 1, wherein the metal layer comprises a platinum film.

4. The method of claim 3, wherein forming the metal layer comprises:
   forming a titanium film on a dielectric layer over the substrate; and
   forming the platinum film on the titanium film.

5. The method of claim 4, wherein the titanium film is formed by E-gun evaporation.

6. The method of claim 3, wherein the platinum film is formed by E-gun evaporation.

7. The method of claim 1, wherein the LaNiO$_3$ film is formed by RF-magnetron sputtering.

8. The method of claim 1, wherein the SrZrO$_3$ film is formed by RF-magnetron sputtering.

9. The method of claim 1, wherein a predetermined area of the bottom electrode is not covered with the buffer layer and the resistor layer thereon, and formation of the top electrode also forms a metal connector in the pre-determined area contacting the bottom electrode.

* * * * *